(12) United States Patent  (10) Patent No.: US 8,222,933 B2
Nagaraj  (45) Date of Patent: Jul. 17, 2012

(54) LOW POWER DIGITAL PHASE LOCK LOOP CIRCUIT

(75) Inventor: Krishnaswamy Nagaraj, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 224 days.

(21) Appl. No.: 12/775,527

(22) Filed: May 7, 2010

(65) Prior Publication Data

US 2011/0273210 A1  Nov. 10, 2011

(51) Int. Cl.
*H03L 7/06* (2006.01)

(52) U.S. Cl. ......... 327/147; 327/148; 327/156; 375/376

(58) Field of Classification Search .................. 327/141, 327/144–163; 331/1 A, 15–17; 375/373–376
See application file for complete search history.

(56) References Cited

U.S. PATENT DOCUMENTS

| | | | |
|---|---|---|---|
| 2003/0198311 A1* | 10/2003 | Song et al. | 375/376 |
| 2004/0263146 A1* | 12/2004 | Boerstler et al. | 324/76.53 |
| 2007/0046343 A1* | 3/2007 | Kurd et al. | 327/156 |
| 2008/0043893 A1* | 2/2008 | Nagaraj et al. | 375/376 |
| 2008/0122550 A1* | 5/2008 | Kurd et al. | 331/185 |
| 2009/0256601 A1* | 10/2009 | Zhang et al. | 327/156 |

* cited by examiner

*Primary Examiner* — Lincoln Donovan
*Assistant Examiner* — Brandon S Cole
(74) *Attorney, Agent, or Firm* — Alan A. R. Cooper; Wade James Brady, III; Frederick J. Telecky, Jr.

(57) ABSTRACT

A digital phase lock loop circuit, where under certain conditions the phase error is derived from phase comparison between a reference clock edge and the next oscillator clock edge rather than a feedback clock edge. This technique can be used to significantly reduce digital phase lock loop circuit power by disabling feedback divider and sync FF once initial frequency lock is established, provided phase jitter of digital phase lock loop circuit is low enough so that there is no cycle slip. This technique can also be used to multiply the effective reference clock frequency of digital phase lock loop circuits to increases the loop bandwidth, thus reducing the phase noise. Both the applications of this technique can be combined in some circuits.

18 Claims, 8 Drawing Sheets

LOW POWER DIGITAL PHASE LOCK LOOP CIRCUIT

BACKGROUND

Phase locked loop (PLL) circuits are widely known and used in computers, radios, telecommunications and many other electronic applications. One of the common uses of a PLL is to synthesize new frequencies ranging from a fraction of Hertz (Hz) up to many gigahertz (GHz), which are a multiple of a reference frequency and are as stable as reference frequency. Typical analog PLLs include a phase and frequency detector (PFD), a charge pump, a loop filter, a current controlled or voltage controlled oscillator (VCO) and a feedback path with a divider. A PLL uses negative feedback to control the output frequency of the oscillator until it matches with the reference signal in both frequency and phase. A fully digital PLL uses a digitally controlled oscillator (DCO), which is more robust and flexible than a conventional VCO. Digital PLLs are easy to design and less sensitive to voltage noise as compared to analog PLLs.

FIG. 1 illustrates a prior art digital phase lock loop (DPLL) circuit 100.

As illustrated in FIG. 1, DPLL circuit 100 includes a phase and frequency detector (PFD) 102, a time to digital convertor (T2D) 104, a digital loop filter 106, a digitally controlled oscillator (DCO) 108, a feedback divider 110 and a synchronizing flip-flop (sync FF) 112. In this illustration, each of PFD 102, T2D 104, digital loop filter 106, DCO 108, feedback divider 110 and sync FF 112 are illustrated as distinct devices. However, at least one of PFD 102, T2D 104, digital loop filter 106, DCO 108, feedback divider 110 and sync FF 112 may be combined as a unitary device.

PFD 102 is arranged to receive a reference clock signal 114 and a feedback clock signal 126 and to output a phase difference pulse 116. T2D 104 is arranged to output a digital word 118 based on phase difference pulse 116. In one example, T2D is arranged to receive phase difference pulse 116 directly from PFD 102. Alternatively, intermediate circuitry may be included to modify phase difference pulse 116 prior to T2D 104. Non-limiting examples of intermediate circuitry include matching networks, amplifiers, filters, resistors, etc.

Digital loop filter 106 is arranged to output a filtered signal 120 based on digital word 118. In one example, digital loop filter 106 is arranged to receive digital word 118 directly from T2D 104. Alternatively, intermediate circuitry may be included to modify digital word 118 prior to digital loop filter 106.

DCO 108 is arranged to output an oscillator clock signal 122 based on filtered signal 120. In one example, DCO 108 is arranged to receive filtered signal 120 directly from digital loop filter 106. Alternatively, intermediate circuitry may be included to modify filtered signal 120 prior to DCO 108.

Feedback divider 110 is arranged to output a divided clock signal 124 based on oscillator clock signal 122. In one example, feedback divider 110 is arranged to receive oscillator clock signal 122 directly from DCO 108 and to output a divided clock signal 124. Alternatively, intermediate circuitry may be included to modify oscillator clock signal 122 prior to feedback divider 110.

Sync FF 112 is arranged to output feedback clock signal 126 by synchronizing divided clock signal 124 with oscillator clock signal 122. In one example, sync FF 112 is arranged to receive divided clock signal 124 directly from feedback divider 110 and to receive oscillator clock signal 122 directly from DCO 108. Alternatively, intermediate circuitry may be included to modify at least one of divided clock signal 124 and oscillator clock signal 122 prior to sync FF 112.

In a conventional DPLL circuit as shown in prior art FIG. 1, reference clock signal 114 is low frequency clock typically in the order of MHz and oscillator clock signal 122 is high frequency clock in the order of GHz. Reference clock signal 114 may be from an external crystal oscillator with a stable frequency. Oscillator clock signal 122 is divided by feedback divider 110 to generate feedback clock signal 126 so that the frequency of feedback clock signal 126 is closer to the order of the frequency of reference clock signal 114. After going through feedback divider 110, reference clock signal 114 and feedback clock signal 126 should line up so that the frequency of oscillator clock signal 122 is a multiple of reference clock signal 114. However, feedback divider 110 introduces noise. Sync FF 112 synchronizes divided clock signal 124 with oscillator clock signal 122 to address this noise by cleaning up the edges of divided clock signal 124.

PFD 102 generates phase difference pulse 116, which is proportional to the phase difference between reference clock signal 114 and feedback clock signal 126. The time duration of phase difference pulse 116 is converted to digital word 118 by T2D 104, which indicates the phase or frequency error between the two clock signals.

Digital loop filter 106 may be a low pass filter, which may operate to eliminate high frequency components of digital word 118 and pass the low frequencies to DCO 108.

DCO 108 may be any known DCO, a non-limiting example of which includes a combination of digital and analog circuits like a digital to analog converter (DAC) and a voltage controlled oscillator (VCO). Other alternate implementations may include current source or fixed capacitor DCOs.

Feedback divider 110 divides oscillator clock signal 122 by an integer number (M) so that divided clock signal 124 matches in frequency and phase with reference clock signal 114. Integer number M may be programmable in most cases, when there is a need to change the output frequency for different applications. Feedback divider 110 and sync FF 112 receive oscillator clock signal 122. Operation of feedback divider 110, and sync FF 112 consumes large amounts of power, even more than the remaining portions of DPLL circuit 100 combined.

FIG. 2 illustrates conventional PFD 102 for DPLL circuit 100 of FIG. 1.

As illustrated in FIG. 2, PFD 102 includes a flip-flop 202, a flip-flop 204 and an AND gate 206.

Flip-flop 202 is arranged to receive an input VDD 208 on its D input, reference clock signal 114 on its C input, and a reset signal 216 on its CLR input and to output an UP signal 212 on its Q output.

Flip-flop 204 is arranged to receive an input VDD 210 on its D input, feedback clock signal 126 on its C input, and reset signal 216 on its CLR input and to output a DOWN signal 214 on its Q output.

AND gate 206 is arranged to receive UP signal 212 and DOWN signal 214 and to output reset signal 216.

PFD 102 compares the phase and frequency of reference clock signal 114 with feedback clock signal 126 in order to eventually lock the two clocks. UP signal 212 and DOWN signal 214 provided by PFD 102 in FIG. 2 represent phase difference pulse 116 of DPLL circuit 100 of FIG. 1.

The "D" inputs of flip-flop 202 and flip-flop 204 are tied to "VDD". When reference clock signal 114 goes high, PFD 102 expects feedback clock signal 126 to be there and rises UP signal 212. When feedback clock signal 126 goes high it makes DOWN signal 214 go high. With UP signal 212 and DOWN signal 214 both high, reset signal 216, an output of AND gate 206 becomes high resetting both flip-flop 202 and flip-flop 204. This in turn terminates both UP signal 212 and DOWN signal 214. UP signal 212 and DOWN signal 214 eventually become zero as reference clock signal 114 and feedback clock signal 126 line up. The relationship between different signals will now be further described with reference to FIG. 3.

FIG. 3 illustrates timing diagram waveforms for the various signals of DPLL circuit 100.

FIG. 3 includes a waveform 302 for oscillator clock signal 122, a waveform 304 for feedback clock signal 126, a waveform 306 for reference clock signal 114, a waveform 308 for DOWN signal 214, a waveform 310 for UP signal 212 and a timeline 312. Here, UP signal 212 and DOWN signal 214 correspond to phase difference pulse 116 from PFD 102. As opposed to showing a single, three-state waveform (a positive HIGH state, a negative HIGH state and a zero state), phase difference pulse 116 is shown as two separate signals, UP signal 212 having a positive HIGH state and a zero state and DOWN signal 214 having a positive HIGH state and a zero state.

Waveform 302 includes clock cycles 313, 315 and 317. Waveform 304 includes a clock cycle 320. Waveform 306 includes a clock cycle 328. Waveform 308 includes pulses 338 and 340. Waveform 310 includes a pulse 346.

As seen in waveform 302, frequency of oscillator clock signal 122 varies based on the phase error between reference clock signal 114 and feedback clock signal 126. Comparing oscillator waveform 304 with waveform 302, it is clear that feedback clock signal 126 goes high once every M cycles of oscillator clock signal 122. Reference clock signal 114 is a master clock signal received by DPLL circuit 100.

As illustrated with waveform 304, waveform 302 and waveform 308, a rising edge 314 of feedback clock signal 126 in the absence of a rising edge of reference clock signal 114 results in DOWN signal 214 transitioning to logic high at a rising edge 330. Conversely, a subsequent occurrence of a rising edge 322 of reference clock signal 114 results in a transition of DOWN signal 214 to logic low at a falling edge 332. The width of pulse 338 of waveform 308 represents how much reference clock signal 114 is lagging feedback clock signal 126.

As illustrated with waveform 304, waveform 306 and waveform 310, a rising edge 324 of reference clock signal 114 in the absence of a rising edge of feedback clock signal 126 results in UP signal 212 transitioning to logic high at a rising edge 342. Conversely, a subsequent occurrence of a rising edge 316 of feedback clock signal 126 results in a transition of UP signal 212 to logic low at a falling edge 344. The width of pulse 346 of waveform 310 represents by how much reference clock signal 114 is leading feedback clock signal 126.

In this example prior art, pulses 338 and 346 represent phase and frequency error between reference clock signal 114 and feedback clock signal 126. When this phase and frequency error is received by DCO 108 via T2D 104 and digital loop filter 106, DCO 108 operates to adjust the frequency of oscillator clock signal 122 provided by DCO 108 so as to match the feedback clock signal 126 with reference clock signal 114 in phase and frequency. Clock cycles 313, 315 and 317 of waveform 302 represent change in the clock period of oscillator clock signal 122 to compensate for phase and frequency error represented by pulses 338, 346 and 340 respectively.

In other words, when phase difference pulse 116 is positive, feedback clock signal 126 lags reference clock signal 114, whereas the width of the pulse in phase difference pulse 116 will indicate how much feedback clock signal 126 lags reference clock signal 114. Similarly, when phase difference pulse 116 is negative, feedback clock signal 126 leads reference clock signal 114, whereas the width of the pulse in phase difference pulse 116 will indicate how much feedback clock signal 126 leads reference clock signal 114. Ideally, phase difference pulse 116 will be zero, (UP signal 212 and DOWN signal 214 will not include any pulses), thus indicating that reference clock signal 114 and feedback clock signal 126 are aligned and oscillator clock signal 122 is locked at a stable frequency.

As discussed above using FIG. 1 through FIG. 3, PFD 102 of conventional DPLL circuit 100 compares feedback clock signal 126 with the reference clock signal 114. However, as discussed above, to generate feedback clock signal 126, DPLL circuit employs feedback divider 110 and sync FF 112. Operation of feedback divider 110 and sync FF 112 consumes lot of power, thus increasing the overall power usage of conventional DPLL circuit 100.

What is needed is a DPLL circuit that will operate with less power than conventional DPLL circuits.

BRIEF SUMMARY

Aspects of the present invention provide a DPLL circuit that operates with less power than conventional DPLL circuits.

A digital phase lock loop circuit is provided for use with a reference clock signal. The digital phase lock loop circuit includes a phase detecting portion, an oscillator, a feedback divider and a switching portion. The phase detecting portion can output a compared signal based on the reference clock signal. The oscillator can output an oscillator clock signal with a frequency, which is a multiple of the frequency of the reference clock signal. The feedback divider can output a divided signal based on the oscillator clock signal. The switching portion can output a first feedback signal based on the oscillator clock signal when in a first state, can output a second feedback signal based on the divided signal when in a second state and can switch from the first state to the second state. The phase detecting portion can further receive a first input feedback signal, based on the first feedback signal, when the switching portion is in the first state. The phase detecting portion can still further receive a second input feedback signal, based on the second feedback signal, when the switching portion is in the second state.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

In accordance with an aspect of the present invention, a DPLL circuit initially functions like a conventional DPLL circuit by correcting the phase error between a reference clock signal and a feedback clock signal until both clock signals are aligned and the DPLL is locked. At that point, under certain conditions, in accordance with aspects of the present invention, the phase error can be derived from a phase comparison between an edge in the reference clock signal and the next closest edge in the oscillator clock signal rather than an edge in the feedback clock signal. In short, the feedback divider and the sync FF are bypassed, whereas the PFD compares the reference clock signal with the oscillator clock signal.

Aspects of the present invention may provide two distinct advantages over conventional DPLL circuits. First, if the phase jitter of DPLL is sufficiently small (which it is in many applications) the feedback divider can be disabled once initial frequency lock is established, thus saving a significant amount of power. Second, the effective frequency of the reference clock may be multiplied and may increase the loop bandwidth, thus reducing phase noise. In some applications, both advantages may be gained.

DPLL power consumption may be reduced by bypassing feedback divider and sync FF in accordance with an aspect of the present invention. This aspect will be described with reference to FIGS. 4-7.

Figure 4:
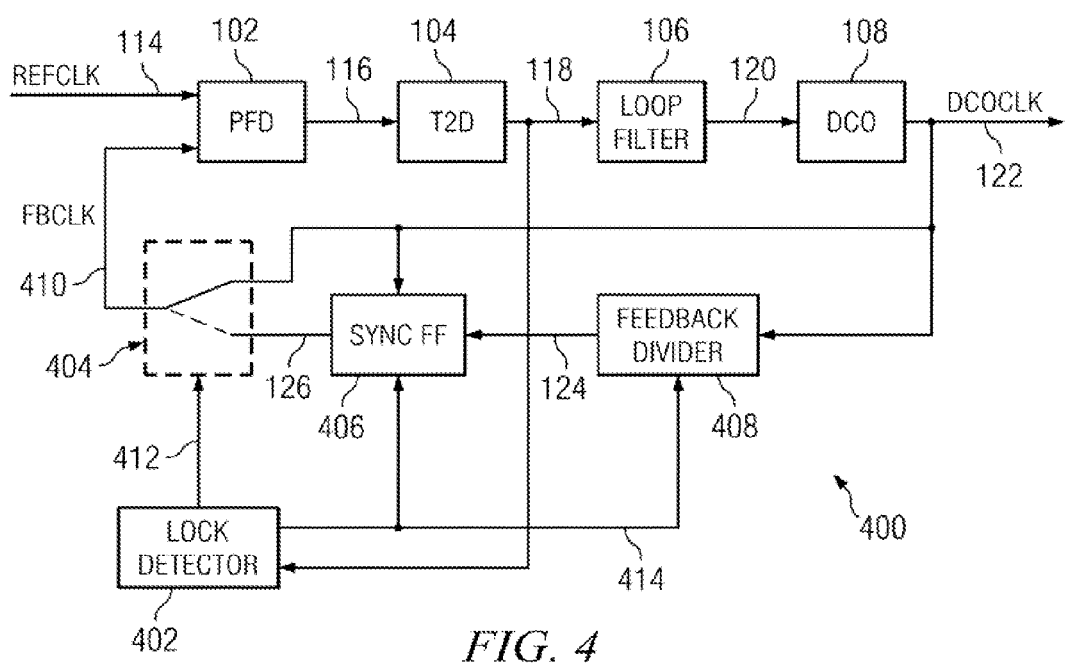
FIG. 4 illustrates an example low power DPLL circuit in accordance with an aspect of the present invention.

FIG. 4 illustrates a low power DPLL circuit 400 in accordance with an aspect of the present invention.

Figure 1:
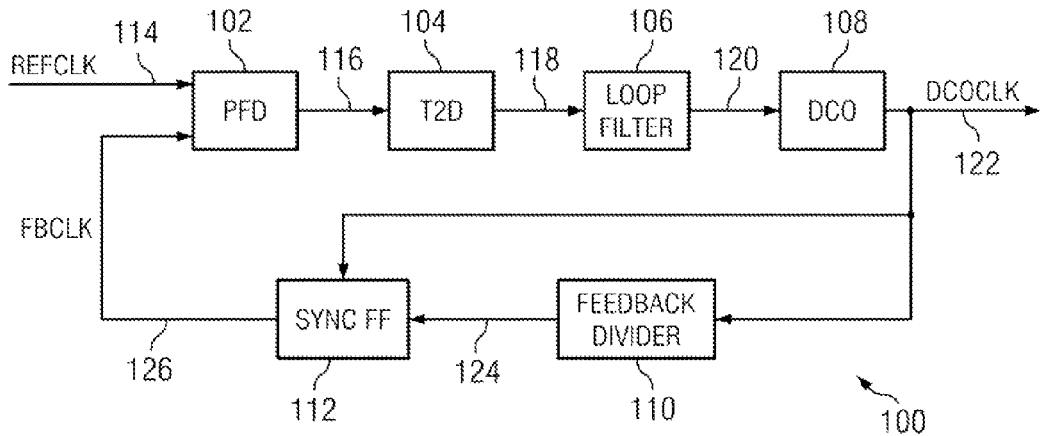
FIG. 1 illustrates a conventional DPLL circuit.

As illustrated in the figure, low power DPLL circuit 400 includes all the elements of DPLL circuit 100 discussed above with reference to FIG. 1, but replaces sync FF 112 with a sync FF 406 and feedback divider 110 with a feedback divider 408 and further includes a lock detector 402 and a switch 404. In this illustration, each of PFD 102, T2D 104, digital loop filter 106, DCO 108, feedback divider 408, sync FF 406, lock detector 402 and switch 404 are illustrated as distinct devices. However, at least one of PFD 102, T2D 104, digital loop filter 106, DCO 108, feedback divider 408, sync FF 406, lock detector 402 and switch 404 may be combined as a unitary device.

Lock detector 402 is arranged to receive digital word 118 from T2D 104 and to output a lock select signal 412 and a bypass enable signal 414. Alternatively, intermediate circuitry may be included to modify digital word 118 prior to lock detector 402.

Feedback divider 408 is arranged to receive oscillator clock signal 122 from DCO 108 and bypass enable signal 414 from lock detector 402 and to output divided clock signal 124. In one example, feedback divider 408 is arranged to receive oscillator clock signal 122 directly from DCO 108 and bypass enable signal 414 from lock detector 402 and to output a divided clock signal 124. Alternatively, intermediate circuitry may be included to modify at least one of oscillator clock signal 122 and bypass enable signal 414 prior to feedback divider 408.

Sync FF 406 is arranged to receive divided clock signal 124 from feedback divider 408, bypass enable signal 414 from lock detector 402 and oscillator clock signal 122 from DCO 108, and to output synchronized divided clock signal 126 to switch 404. In one example, sync FF 406 is arranged to receive divided clock signal 124 directly from feedback divider 408 and to receive oscillator clock signal 122 directly from DCO 108 and to receive bypass enable signal 414 directly from lock detector 402. Alternatively, intermediate circuitry may be included to modify at least one of divided clock signal 124, bypass enable signal 414 and oscillator clock signal 122 prior to sync FF 406.

Switch 404 is arranged to receive synchronized divided clock signal 126 from sync FF 406, oscillator clock signal 122 from DCO 108 and lock select signal 412 from lock detector 402 and to output a feedback clock signal 410 to PFD 102. In one example, switch 404 is arranged to receive synchronized divided clock signal 126 directly from sync FF 406 and to receive oscillator clock signal 122 directly from DCO 108 and to receive bypass lock select signal 412 directly from lock detector 402. Alternatively, intermediate circuitry may be included to modify at least one of synchronized divided clock signal 126, bypass lock select signal 412 and oscillator clock signal 122 prior to sync FF 406.

In one example embodiment of the present invention, once DPLL circuit 400 is locked at a stable frequency, lock detector 402 instructs switch 404 to output feedback clock signal 410 based on oscillator clock signal 122 and asserts bypass enable signal 414 in order to disable sync FF 406 and feedback divider 408. This will be described in greater detail below.

Figure 2:
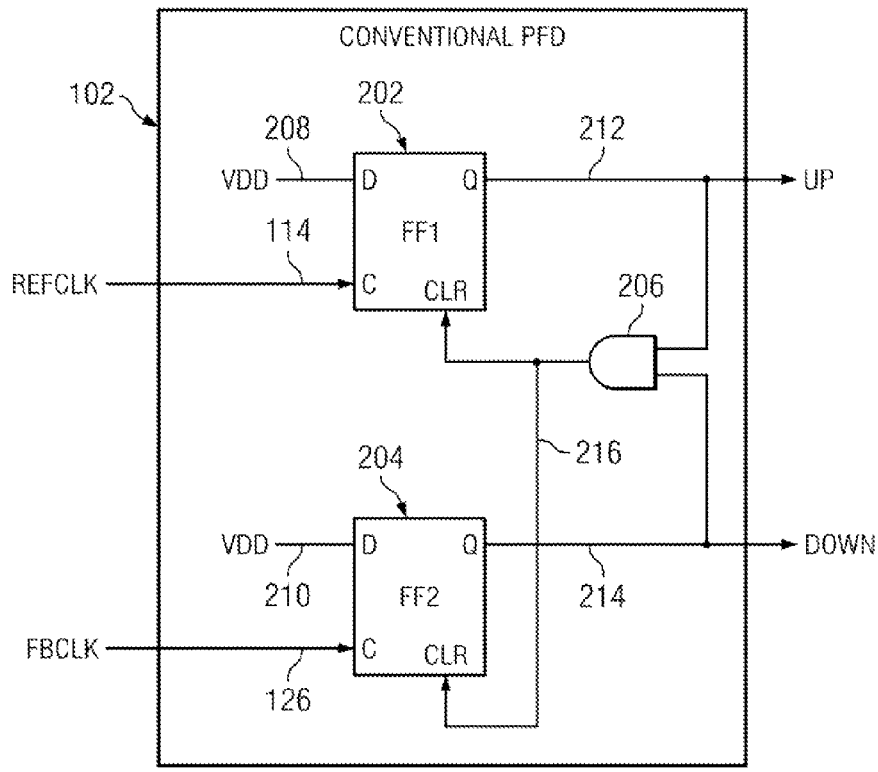
FIG. 2 illustrates a conventional PFD for the conventional DPLL circuit of FIG. 1.
Figure 3:
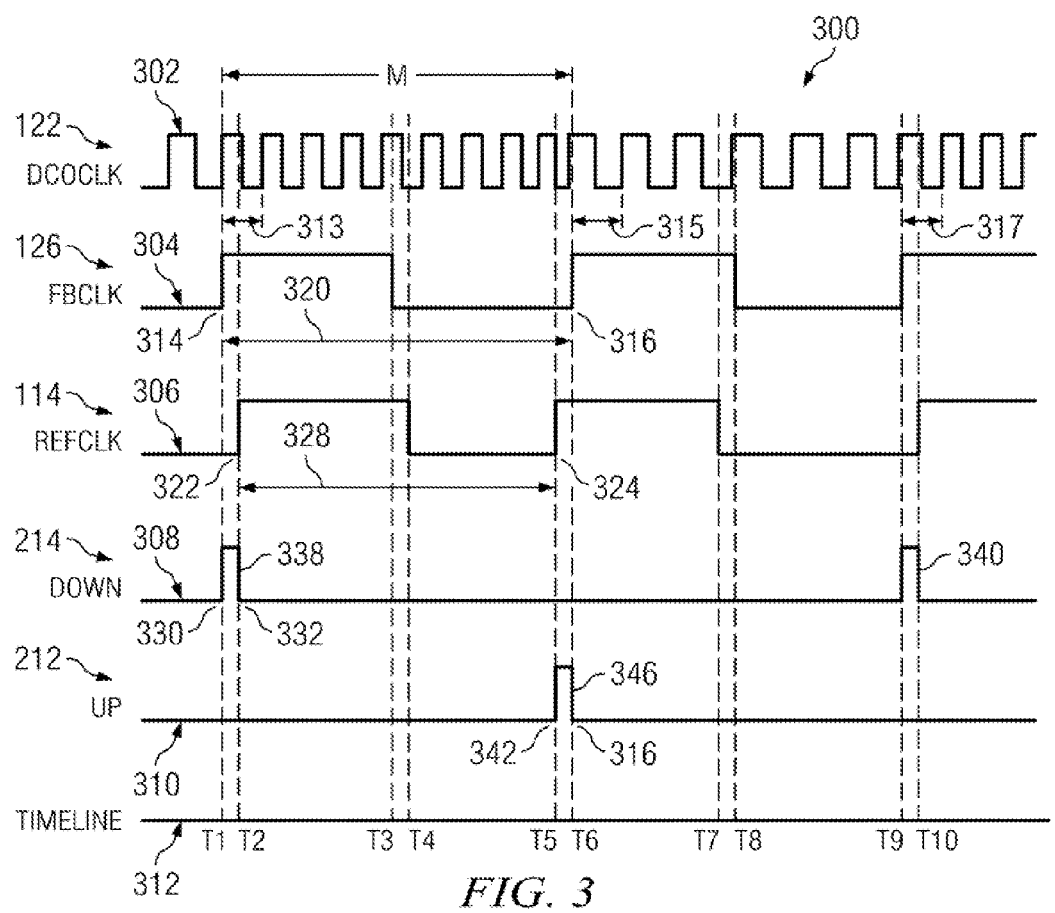
FIG. 3 illustrates timing diagrams for the conventional DPLL circuit of FIG. 1.

For purposes of discussion, presume that initially, reference clock signal 114 and feedback clock signal 410 differ in phase and frequency. In this case low power DPLL circuit 400 may operate in a similar manner as DPLL circuit 100 discussed above with reference to FIGS. 1-3. DPLL circuit 400 operates to adjust the frequency of oscillator clock signal 122 provided by DCO 108 until it is matched to the reference clock signal 114 in both frequency and phase. During this operation, lock detector 402 instructs switch 404 to select synchronized divided clock signal 126 as feedback clock signal 410.

Suppose low power DPLL circuit 400 then locks feedback clock signal 410 with reference clock signal 114. At this point, lock detector 402 detects a lock situation. In this example embodiment, lock detector 402 detects a lock situation based on digital word 118 from T2D 104. A basis for determining a locked situation may be derived from any known method, a non-limiting example of which includes determination of the pulse width of an UP signal 212 or DOWN signal 214 corresponding to digital word 118, for example as discussed above with reference to FIG. 3.

When reference clock signal 114 and feedback clock signal 410 line up, pulses corresponding to UP signal 212 and DOWN signal 214 within phase difference pulse 116 become zero, which is an indication that low power DPLL circuit 400 is locked. When an lock condition has been recognized by lock detector 402, lock detector 402 instructs switch 404, by way of lock select signal 412, to select oscillator clock signal 122 as feedback clock signal 410. Switch 404 then selects and provides oscillator clock signal 122 as feedback clock signal 410 to be compared with reference clock signal 114 by PFD 102.

In lock state, when switch 404 selects and provides oscillator clock signal 122 as feedback clock signal 410, lock detector 402 asserts bypass enable signal 414 in order to disable sync FF 406 and feedback divider 408. As a result of being disabled, feedback divider 408 and sync FF 406 do not consume power. Thus in a locked state, the power consumption of low power DPLL circuit 400 is significantly reduced as compared to DPLL circuit 100, as a result of disabling the operation of feedback divider 408 and sync FF 406.

DPLL circuit 400 may lose the lock condition in some cases. Non-limiting examples of reasons for losing lock include power supply noise, excessive jitter or switching noise on reference clock or resetting the PLL. Following a loss of lock, it may be possible for a condition of lock to be reestablished. The time required for DPLL circuit 400 to react and regain lock again may depend mainly on the frequency of reference clock signal 114 and divider setting (M) for feedback divider 408. DCO 108 would attempt to either increase or decrease in frequency to match the input frequency of PFD 102. Once DPLL circuit 400 gains frequency lock, PFD 102 would try to match the phase of the reference clock signal 114 with the feedback clock signal 410 in order to re-establish the DPLL circuit 400 lock at a stable frequency.

It should be noted, returning to FIG. 3, that oscillator clock signal 122 has a much higher frequency than reference clock signal 114. Therefore, once DPLL circuit 400 is locked, oscillator clock signal 122 is provided to PFD 102 as feedback clock signal 410, which is now a much higher frequency as compared to reference clock signal 114. In many cases, PFD 102 may not function properly as a result of such a gross disparity in the frequencies. In particular, as seen in waveform 302, rising clock edges of oscillator clock signal 122, and thus rising edges of feedback clock signal 410, are arriving at PFD 102 at a very rapid rate as compared to rising edges of waveform 306, corresponding to reference clock signal 114. As a result, DOWN signal 214 would remain high for a long period before reference clock signal 114 transitions to high. To overcome this problem, an example embodiment of the present invention will now be discussed further, which includes a modified PFD.

Figure 5:
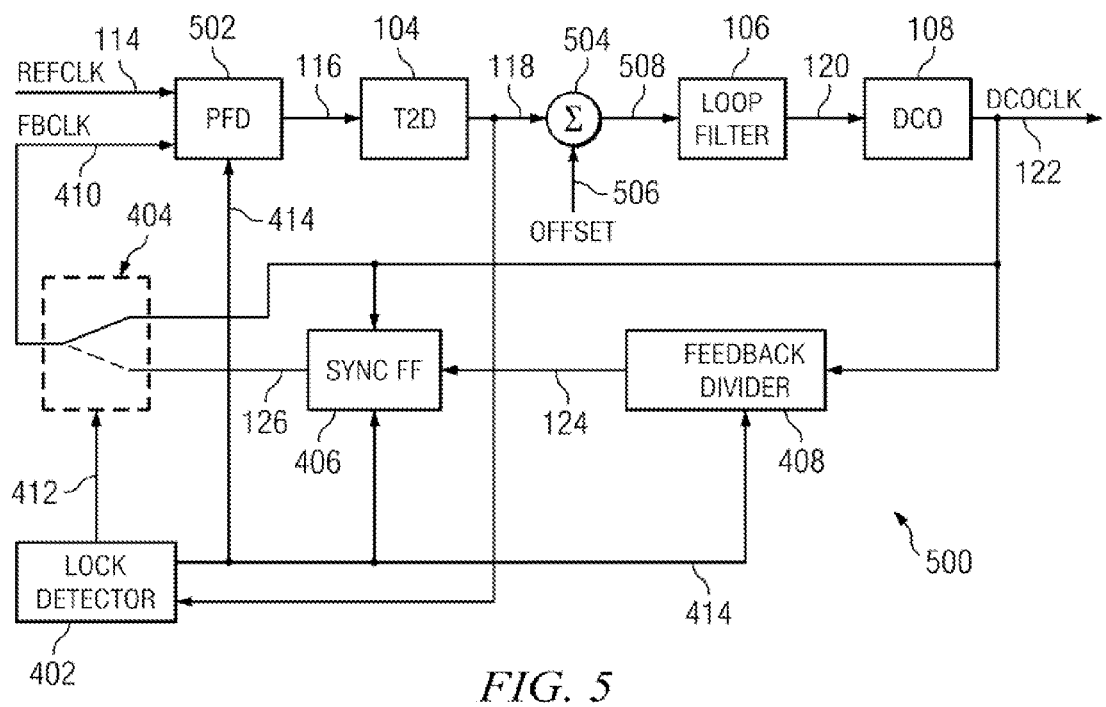
FIG. 5 illustrates another example low power DPLL circuit in accordance with an aspect of the present invention.

FIG. 5 illustrates an example low power DPLL circuit 500 in accordance with an aspect of the present invention.

As illustrated in the figure, low power DPLL circuit 500 includes the elements of low power DPLL circuit 400, but replaces PFD 102 with a PFD 502 and further includes an adder 504. In this illustration, each of PFD 502, T2D 104, adder 504, digital loop filter 106, DCO 108, feedback divider 408, sync FF 406, lock detector 402 and switch 404 are illustrated as distinct devices. However, at least one of PFD 502, T2D 104, adder 504, digital loop filter 106, DCO 108, feedback divider 408, sync FF 406, lock detector 402 and switch 404 may be combined as a unitary device.

Modified PFD 502 is arranged to receive reference clock signal 114, feedback clock signal 410 and bypass enable signal 414 from lock detector 402 and to output phase difference pulse 116. Adder 504 is arranged to receive digital word 118 from T2D 104 and an offset signal 506 and to output a corrected digital word 508. Digital loop filter 106 is arranged to receive corrected digital word 508 from adder 504 and to output filtered signal 120. Switch 404 is arranged to receive synchronized divided clock signal 126 from sync FF 406, oscillator clock signal 122 from DCO 108 and lock select signal 412 from lock detector 402 and to output feedback clock signal 410 to PFD 502.

FIG. 5 shows one exemplary embodiment of how devices PFD 502, T2D 104, adder 504, digital loop filter 106, DCO 108, feedback divider 408, sync FF 406, lock detector 402 and switch 404 may be connected. However, intermediate circuitry may be included between any two devices which are connected directly in FIG. 5.

Adder 504 adds offset signal 506 to digital word 118. The magnitude of this offset is equivalent to the largest phase difference that would be expected between reference clock signal 114 and feedback clock signal 410, once the condition of lock has been realized. The phase difference may be caused by phase noise and is of typically small magnitude. The sign of the offset is same as that of DOWN signal 214. To cancel this offset, low power DPLL circuit 500 settles to a state where feedback clock signal 410 is slightly trailing reference clock signal 114 in phase, thus producing UP signal 212 only. The varying width of UP signal 212 contains the phase error information. This modification makes PFD 502 realizable. This will be described in more detail below with reference to FIGS. 6 and 7.

Figure 6:
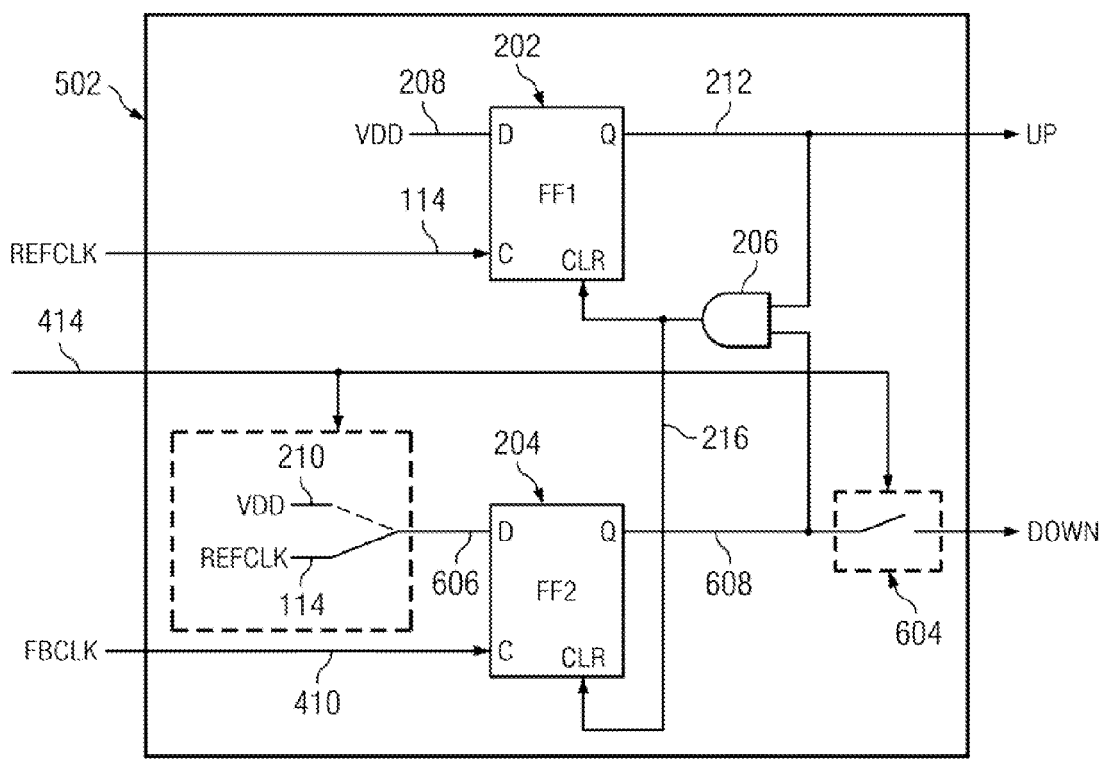
FIG. 6 illustrates an example PFD in accordance with an aspect of the present invention.

FIG. 6 illustrates an example modified PFD 502 in accordance with an aspect of the present invention.

As illustrated in the figure, modified PFD 502 includes the elements of PFD 102 discussed above with reference to FIG. 2, but further includes a switch 602, a switch 604 and input bypass enable signal 414.

Switch 602 is arranged to receive input VDD 210, reference clock signal 114 and bypass enable signal 414 and to output a data signal 606. Flip-flop 204 is arranged to receive data signal 606, feedback clock signal 410, reset signal 216, and output a DOWN signal 608. AND gate 206 is arranged to receive UP signal 212, DOWN signal 608 and to output reset signal 216. Switch 604 is arranged to receive DOWN signal 608, bypass enable signal 414, and to output DOWN signal 608. Switch 604 is closed when bypass enable signal 414 is not asserted and provides DOWN signal 608 on its output. When bypass enable signal 414 is asserted, switch 604 is open and there is no signal at its output.

In initial operation, bypass enable signal 414 is de-asserted and the D input of flip-flop 204 is connected to input VDD 210 and switch 604 is closed to provide DOWN signal 608 from flip-flop 204. During the normal operation of low power DPLL circuit 500, PFD 502 compares reference clock signal 114 with synchronized divided clock signal 126 as feedback clock signal 410 to generate phase difference pulse 116. Once reference clock signal 114 and feedback clock signal 410 match in phase and frequency, low power DPLL circuit 500 is locked. In this case, bypass enable signal 414 is asserted, which disables sync FF 406 and feedback divider 408. Furthermore, switch 404 provides oscillator clock signal 122 as feedback clock signal 410 to PFD 502.

PFD 502 is reconfigured once oscillator clock signal 122 is locked to reference clock signal 114. As illustrated in FIG. 6, asserting bypass enable signal 414 instructs switch 602 to use reference clock signal 114 as data signal 606 to D input of flip-flop 204 and also instructs switch 604 to open. As soon as reference clock signal 114 transitions high, UP signal 212 goes high. At the rising edge of the following pulse within feedback clock signal 410, output DOWN signal 608 of flip-flop 204 transitions high.

With both inputs of AND gate 206 high, output reset signal 216 becomes high, which resets both flip-flop 202 and flip-flop 204. Resetting both flip-flops de-asserts UP signal 212 and DOWN signal 608 provided by flip-flop 204. In this case switch 604 is open, which means DOWN signal 608 is not provided as output of switch 604. Furthermore, when switch 604 is open, no pulses of DOWN signal 608 are provided to T2D 104. This operation of PFD 502 will be described using timing diagrams with reference to FIG. 7.

Figure 7:
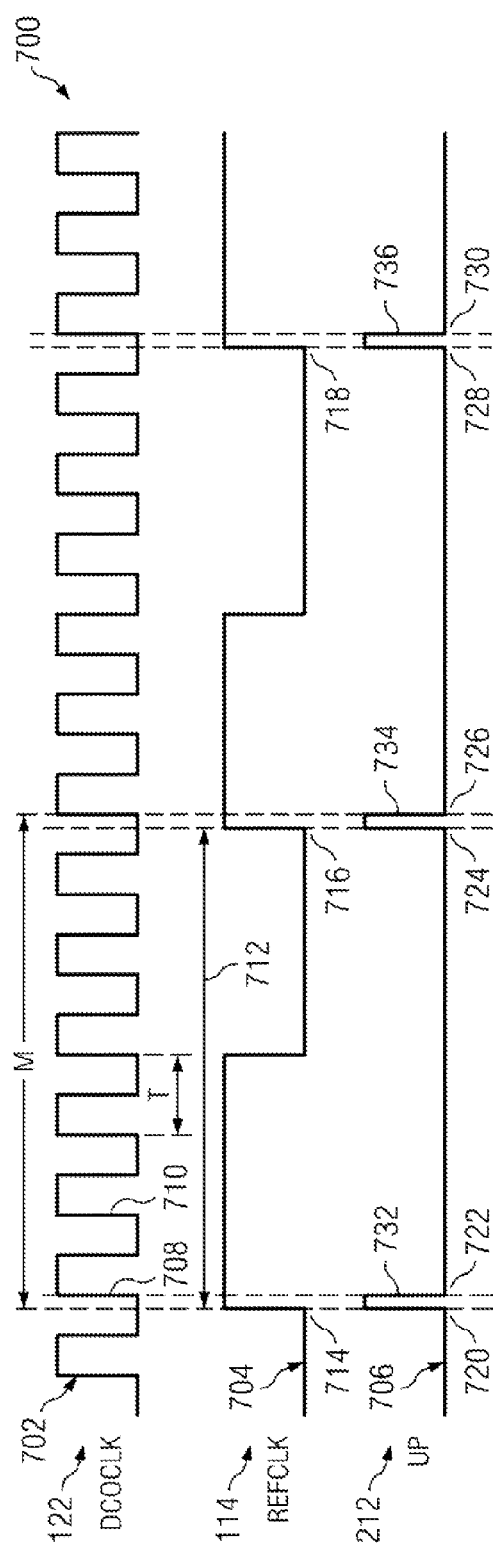
FIG. 7 illustrates timing diagrams for the PFD of FIG. 6.

FIG. 7 illustrates timing diagrams for modified PFD 502 of FIG. 6.

FIG. 7 includes a waveform 702 for oscillator clock signal 122, a waveform 704 for reference clock signal 114, and a waveform 706 for UP signal 212. As opposed to showing a single, three-state waveform (a positive HIGH state, a negative HIGH state and a zero state), UP signal 212 is shown having a positive HIGH state and a zero state.

Waveform 702 includes a clock cycle T. Waveform 704 includes a clock cycle 712. Waveform 706 includes pulses 732, 734 and 736.

FIG. 7 illustrates waveforms for modified low power DPLL circuit 500 when low power DPLL circuit 500 is in a locked state. As illustrated previously, in a locked state modified PFD 502 is receiving high frequency oscillator clock signal 122 as feedback clock signal 410. Adding offset signal 506 to digital word 118 guarantees that feedback clock signal 410 is always lagging reference clock signal 114. Consequently, there is an edge of oscillator clock signal 122 closer to an edge of reference clock signal 114. Since feedback clock signal 410 is always lagging reference clock signal 114, modified PFD 502 provides UP signal 212 of varying pulse width and the DOWN signal 608 is disabled.

As seen in waveform 702, waveform 704 and waveform 706, a rising edge 714 of reference clock signal 114 in the absence of a rising edge of oscillator clock signal 122 makes UP signal 212 go high at a rising edge 720. Conversely, a subsequent occurrence of a rising edge 708 of oscillator clock signal 122 transitions UP signal 212 to low at a falling edge 722. Pulse 732 of waveform 706 is a representation of the magnitude for which oscillator clock signal 122 is lagging reference clock signal 114.

FIG. 4 through FIG. 7 illustrated how an example DPLL circuit in accordance with aspects of the present invention may operate at significantly reduced power. In particular, low power DPLL circuit 400 operates at reduced power once oscillator clock signal 122 is locked to reference clock signal 114 in phase and frequency. In that case, lock detector 402 disables sync FF 406 and feedback divider 408 and instructs switch 404 to provide oscillator clock signal 122 as feedback clock signal 410 to PFD 102. However, conventional PFD 102 may not be able to support an oscillator clock signal 122 of a high frequency as feedback clock signal 410. As shown in FIG. 5 and FIG. 6, modified PFD 502 and adder 504 address this problem by adding offset signal 506 to digital word 118 and disabling. DOWN signal 608 provided by PFD 502. This modification makes PFD 502 realizable. For situations, where power consumption by the feedback divider 408 is not an issue, switch 404 may not be needed.

PLLs are used to implement a variety of timing related functions and therefore any undesired variations in timing of events at the output of the PLL are of great concern. Jitter is a measurement of variations in time domain, which essentially describes how far a signal period has wandered off from its ideal value. Phase noise is a measurement of the variations in frequency domain. Sometimes it's useful to derive the jitter value from a phase noise measurement, which is called phase jitter.

Conventional PLLs are susceptible to different kinds of jitter, which affect the response time of the PLL, measured as its loop bandwidth. One of the common causes of jitter is sensitivity of PLL circuits to internal noise sources (thermal, flicker, etc.) or external noise sources (power supply, substrate, etc.). Jitter can be measured as variations in the clock period or in the accumulated widths of many clock periods. It can also be measured as time relationship between the edges of reference clock signal and oscillator clock signal.

If phase jitter is more than one clock cycle (T) of oscillator clock signal 122, it would cause PFD 102 to skip one cycle of oscillator clock signal 122 and compare the next edge. Referring back to FIG. 7, waveform 702 shows two consecutive occurrences of rising edge 708 and a rising edge 710 of oscillator clock signal 122. Because of phase jitter being more than T, PFD 102 could compare rising edge 714 of reference clock signal 114 with rising edge 710 of oscillator clock signal 122 instead of rising edge 708. This cycle slip could result in a loss of frequency lock for low power DPLL circuit 500. Therefore, an important requirement for low power DPLL circuit 500 to function properly is that phase jitter should not exceed one clock cycle (T) of oscillator clock signal 122. This requirement makes low power DPLL circuit 500 suitable for applications that require low phase noise digital phase locked loop circuits.

Two sources of jitter can affect low power DPLL circuit 500—DCO quantization and DCO phase noise, which will now be further described.

The first source of jitter in DPLL circuits to be addressed is DCO quantization. Unlike analog PLLs, in DPLL circuits, the frequency of oscillator clock signal 122, provided by DCO 108 may be controlled by a DAC, which allows for a wide tuning range. A non-limiting example of a DAC could be a 10-bit current mode digital-to-analog converter. Because of the discrete nature of DCO 108 control, the frequency of oscillator clock signal 122 provided by DCO 108 can never be exactly locked to the required value. Instead, the loop causes the control of DCO 108 to bounce up and down, typically by 1 least significant bit (LSB). This results in variations in the frequency of oscillator clock signal 122 even though the average frequency is equal to the desired value. Because of this variation in the frequency of oscillator clock signal 122, there is a buildup of phase error during the period from one edge of reference clock signal 114 to the next edge. This will be described in detail below with respect to FIG. 3.

Referring back to FIG. 3, pulse 338 of waveform 308 represents an example phase error, which causes the frequency of oscillator clock signal 122 to change so as to minimize the phase error. This change in frequency of oscillator clock signal 122 is represented by clock cycle 313 of waveform 302. The resulting frequency correction in practice causes a phase error buildup in the opposite direction. Pulse 346 of waveform 310 represents another example phase error, which causes an opposite frequency correction of oscillator clock signal 122 to change so as to minimize the phase error. This change in frequency of oscillator clock signal 122 is represented by clock cycle 315 of waveform 302. Similarly, pulse 340 of waveform 308 causes change in frequency of oscillator clock signal 122, represented by clock cycle 317 of waveform 302. This process continuously repeats, wherein the frequency of oscillator clock signal 122 "jitters" around the target frequency.

The peak value of the phase error due to this effect is a function of the LSB of the DAC within DCO 108 and the frequency of reference clock signal 114. As the frequency of reference clock signal 114 decreases the peak value of the phase error increases, which puts a lower limit on the frequency of reference clock signal 114. Also for larger LSBs, the peak value of the phase error is more. One non-limiting example of lowering the frequency of reference clock signal 114 may be by making the DAC for DCO 108 finer or having a smaller LSB, although the DAC may be larger in area. An aspect of the present invention to lower the frequency of reference clock signal 114 is further explained with reference to an example explained in the following paragraph.

For the purposes of discussion, suppose the frequency of oscillator clock signal 122 is required to be 1 GHz and DAC LSB for DCO 108 is 2 MHz. This results in maximum error in the frequency of oscillator clock signal 122 of ±1 MHz due to quantization error. It can be shown that for a cycle slip not to occur, the operating frequency of PFD 502, i.e, the PFD comparison frequency at which PFD 502 compares reference clock signal 114 and feedback clock signal 410, has to be greater than 1 MHz. In other words, the frequency of both reference clock signal 114 and feedback clock signal 410 would both have to be greater than 1 MHz. For the purpose of discussion the frequency at which PFD 502 operates will henceforth be designated as the PFD frequency. A 1 MHz limit on the PFD frequency limits output frequency resolution of DCO 108 to 1 MHz. Having a lower limit on the PFD frequency can be problematic in practice. It can be addressed by using example methods described below.

First, coarse segments of the DAC within DCO 108 may be introduced and which are set appropriately during calibration. This can easily reduce the DAC LSB for DCO 108 by a factor of 4, giving a factor of 4× improvement in the lower limit on reference clock signal 114.

Second, in many recent DPLL implementations, resolution of the DAC is increased by using Sigma-Delta dithering. This is done to reduce phase jitter as demanded by certain applications. The dithering reduces the effective DAC LSB for DCO 108 by large factor (e.g., 128). Accordingly, it reduces frequency of reference clock signal 114 to very low values without encountering cycle slip problem.

In summary, the problem with DCO quantization was discussed as the first source of jitter in example embodiment low power DPLL circuit 500. DCO quantization issues may be caused by the discrete nature of DCO 108, which puts a lower limit on the frequency of reference clock signal 114. Two methods discussed above to solve this problem were either using coarse segments of the DAC within DCO 108 or using Sigma-Delta dithering to increase the resolution of the DAC.

The second source of jitter in DPLL circuits to be addressed is DCO phase noise. Except for very low end DPLLs (in terms of jitter performance), oscillator phase noise is usually a small percentage (1 to 2%) of oscillator clock period. Thus, cycle slip is not a problem.

An important attribute of a PLL is the loop bandwidth. A higher loop bandwidth provides a better suppression of the oscillator phase noise and consequently results in a lower phase noise in the PLL output clock. However, the maximum loop bandwidth under which a PLL can safely be operated is usually about 1/10 of the PFD frequency. If the loop bandwidth is set to be higher than this, the stability of the loop is degraded. Thus, in order to increase the loop bandwidth, the PFD frequency has to be increased. The maximum PFD frequency is in practice limited by two factors. First, the resolution to which the output frequency can be programmed is a direct function of the frequency of the feedback signal which in turn puts a limit on the maximum PFD frequency. Secondly, in some applications, there may be an upper limit on the PFD frequency imposed by a particular choice of the external reference frequency. Another aspect in accordance with an embodiment present invention will now be described, wherein it will be discussed how the frequency of PFD clock signal 114 of low power DPLL circuit 500 can be increased without compromising the output frequency resolution, thus increasing loop bandwidth and reducing the phase noise of an example FM synthesizer module.

For purposes of discussion, presume that the frequency of an output divided clock signal of low power DPLL circuit 500 is required to be within a band of 76 MHz to 108 MHz, and be provided in 50 KHz steps. In this example, presume that an output divider (not shown) is set to 24, meaning it will divide the frequency of oscillator clock signal 122 by 24. This will result in a frequency of oscillator clock signal 122 in the 2.4 GHz range.

To provide 50 KHz steps in the output divided clock signal, the frequency of oscillator clock signal 122 has to be adjustable in 1.2 MHz steps. Accordingly, the frequency of feedback signal 114 has to be 1.2 MHz or less, limiting the PFD frequency to 1.2 MHz or less. As such, the loop bandwidth will be limited to about 120 KHz, which is about one tenth of the frequency of reference clock signal 114. This would be insufficient to meet the phase noise requirement of the FM synthesizer discussed above.

For the same parameters of an output divided clock signal of low power DPLL circuit 500, consider the situation where the frequency of the output divided clock signal is 100.05 MHz. In such a situation, feedback divider 408 should be set to divide the frequency of oscillator clock signal 122 by a factor of 2001 (M=2001) in order to provide the frequency of oscillator clock signal 122 at 2.4012 GHz.

Presume, for the sake of discussion that the frequency of reference clock signal 114 is increased to 4.8 MHz, while the frequency of feedback clock signal 410 is maintained at 1.2 MHz, ignoring phase noise for the moment. Waveforms for this case are illustrated in FIG. 8.

Figure 8:
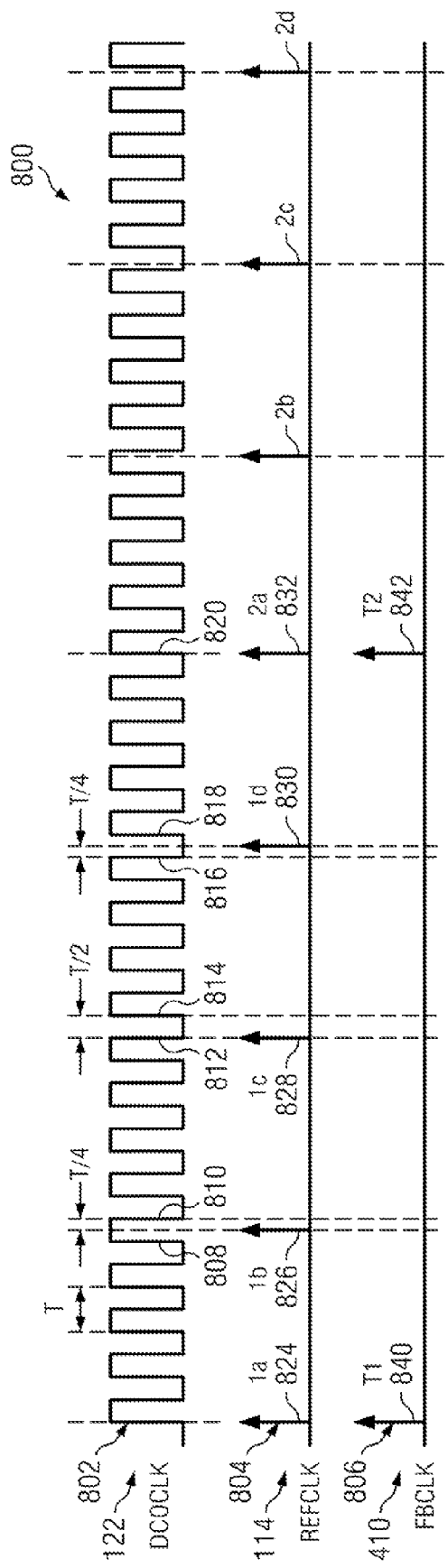
FIG. 8 illustrates timing diagrams for the DPLL of FIG. 5, with an example error corrector.

FIG. 8 illustrates timing diagrams for an embodiment of low power DPLL circuit 500.

For purposes of discussion, rising edges of reference clock signal 114 and feedback clock signal 410 are represented by impulses in FIG. 8. FIG. 8 includes a waveform 802 for oscillator clock signal 122, an impulse waveform 804 for reference clock signal 114, and an impulse waveform 806 for feedback clock signal 410. Waveform 802 includes a clock cycle T. Impulse waveform 804 includes impulses 824 (indicated at position 1a), 826 (indicated at position 1b), 828 (indicated at position 1c), 830 (indicated at position 1d), 832 (indicated at position 2a), 834 (indicated at position 2b), 836 (indicated at position 2c) and 838 (indicated at position 2d), which represent corresponding rising edges for reference clock signal 114. Impulse waveform 806 includes impulses 840 at T1 and 842 at T2, which represent corresponding rising edges for feedback clock signal 410. Note that for purposes of discussion, rising edge and impulse is used interchangeably with respect to FIG. 8.

For purposes of discussion, presume reference clock signal 114 has a frequency of 4.8 MHz. In this example, for every four rising edges of reference clock signal 114, a rising edge of feedback clock signal 410 is provided to PFD 102. As shown in FIG. 8, there is one impulse 840 of feedback clock signal 410 corresponding to impulse 824 of reference clock signal 114. For the remaining three impulses 826, 828 and 830 of reference clock signal 114 that are provided to PFD 102, there is no impulse for feedback clock signal 410.

Nevertheless, there is a defined phase relationship between rising edge 826 of reference clock signal 114 and the subsequent occurrence of a rising edge 810 of oscillator clock signal 122, and between rising edge 828 of reference clock signal 114 and the subsequent occurrence of a rising edge 814 of oscillator clock signal 122, and between rising edge 830 of reference clock signal 114 and the subsequent occurrence of a rising edge 818 of oscillator clock signal 122.

For example, for feedback divider 408 equal to 2001, at position 1b, oscillator clock signal 122 would have completed 500.25 cycles. Thus, the next rising edge 808 of oscillator clock signal 122 will be 0.75 (3T/4) oscillator clock period away from rising edge 826 of reference clock signal 114. Similarly, at position 1c, oscillator clock signal 127 would have completed 1000.50 cycles and the next rising edge 812 of oscillator clock signal 122 will be 0.5 (T/4) period away from the rising edge 828 of reference clock signal 114. Similarly, at position 1d, oscillator clock signal 122 would have completed 1500.75 cycles and the rising edge 816 of oscillator clock signal 122 will be 0.25 (T/4) oscillator clock period away from the rising edge 830 of reference clock signal 114. For the next rising edge 842 of feedback clock signal 410, at position 2a, rising edge 832 of reference clock signal 114 lines up with rising edge 820 of oscillator clock signal 122.

Figure 9:
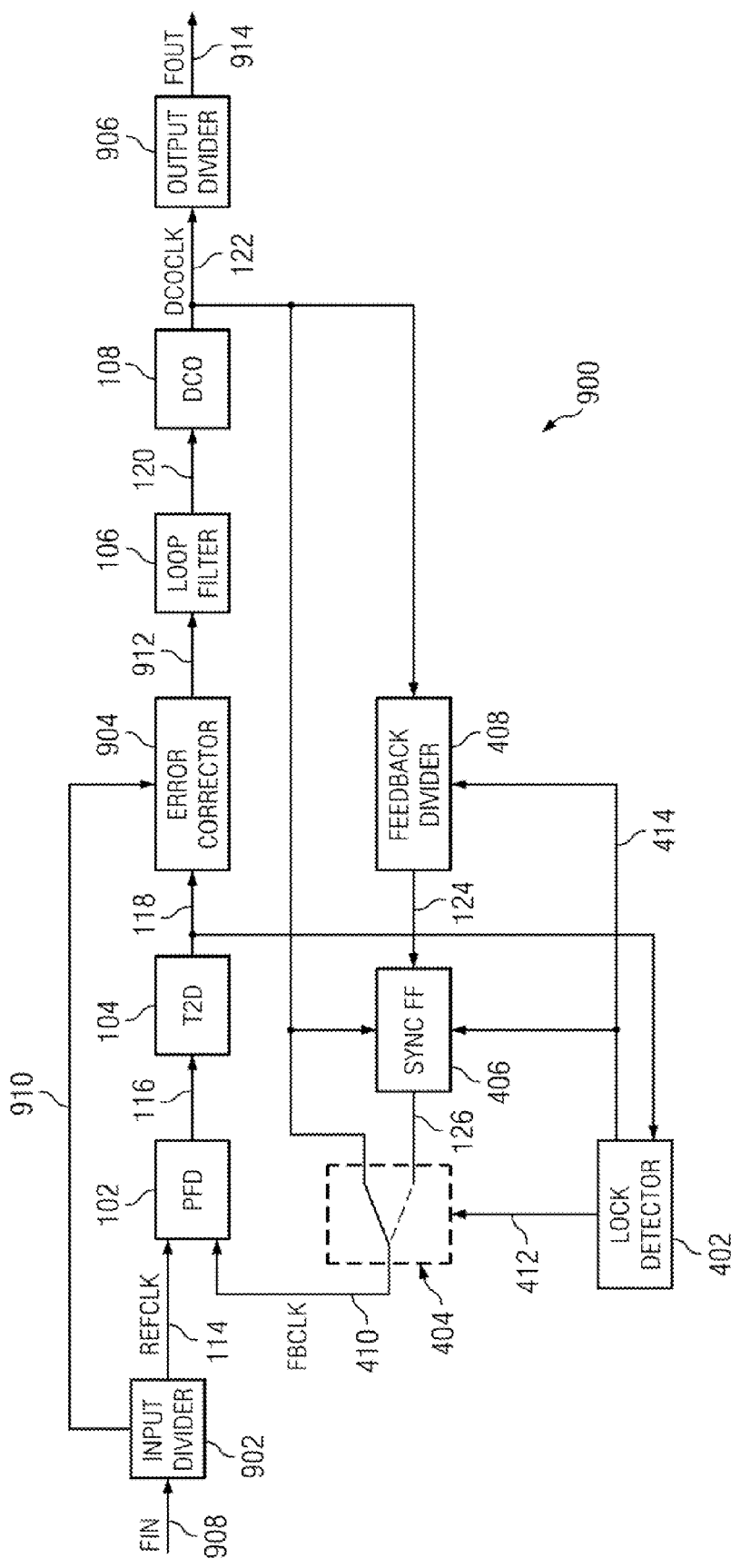
FIG. 9 illustrates another example low power DPLL circuit in accordance with an aspect of the present invention.

FIG. 9 illustrates another example low power DPLL circuit 900 in accordance with an aspect of the present invention.

As illustrated in the figure, low power DPLL circuit 900 includes all the elements of low power DPLL circuit 400 of FIG. 4, with the addition of an input divider 902, an error corrector 904 and an output divider 906. In this illustration, each of input divider 902, PFD 102, T2D 104, error corrector 904, digital loop filter 106, DCO 108, output divider 906, feedback divider 408, sync FF 406, lock detector 402 and switch 404 are illustrated as distinct devices. However, at least one of input divider 902, PFD 102, T2D 104, error corrector 904, digital loop filter 106, DCO. 108, output divider 906, feedback divider 408, sync FF 406, lock detector 402 and switch 404 may be combined as a unitary device.

Input divider 902 is arranged to receive an input clock signal 908 and to output reference clock signal 114 and a select signal 910. Error corrector 904 is arranged to receive digital word 118 from T2D 104 and select signal 910 from input divider 902 and to output a corrected digital word 912. Digital loop filter 106 is arranged to receive corrected digital word 912 from error corrector 904 and to output filtered signal 120. Output divider 906 is arranged to receive oscillator clock signal 122 and to output a divided clock signal 914.

FIG. 9 shows one exemplary embodiment of how devices input divider 902, PFD 102, T2D 104, error corrector 904, digital loop filter 106, DCO 108, output divider 906, feedback divider 408, sync FF 406, lock detector 402 and switch 404 may be connected. However, intermediate circuitry may be included between any two devices which are connected directly in FIG. 9.

Input divider 902 operates to divide input clock signal 908 for generating reference clock signal 114 with a programmable frequency. Input clock signal 908 may be provided by an external crystal oscillator with a stable frequency. Similarly, output divider 906 divides oscillator clock signal 122 provided by DCO 108 in order to generate divided clock signal 914. Input divider 902 and output divider 906 are often used in order to provide programmable frequency for input and output clock signals of frequency synthesizer circuits. Error corrector 904 is used in this example embodiment to provide an appropriate phase difference pulse to digital loop filter 106 as discussed further.

Initial operation of low power DPLL circuit 900 for establishing a lock between reference clock signal 114 and feedback clock signal 410 is similar to the operation of low power DPLL circuit 400 as described previously. When low power DPLL circuit 900 is locked, the number of cycles for reference clock signal 114 and feedback clock signal 410 are expected to be equal. Once lock is established, PFD 102 is seeking for the nearest edge of oscillator clock signal 122, which matches with an edge of reference clock signal 114.

Figure 10:
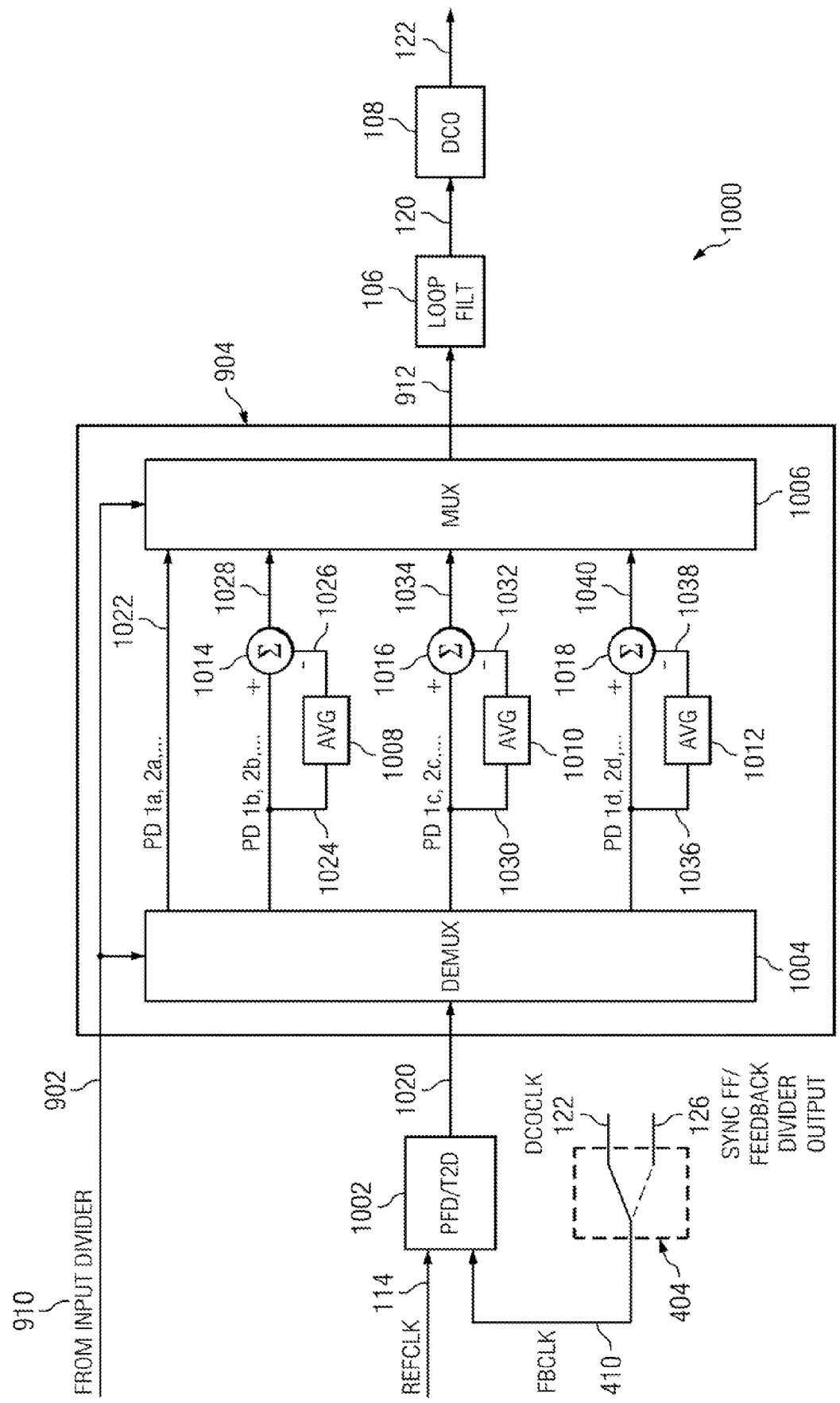
FIG. 10 illustrates the error corrector of FIG. 9 in accordance with an aspect of the present invention.

This is further discussed using FIG. 10 where error corrector 904 is used to enhance the loop bandwidth of the low power DPLL circuit 900. Error corrector 904 operates to provide an appropriate phase difference pulse to digital loop filter 106 as discussed further.

FIG. 10 illustrates error corrector 904 of FIG. 9 and its interface with other elements of low power DPLL circuit 900 in accordance with an aspect of the present invention.

As illustrated in the figure, error corrector 904 includes a demux 1004, a mux 1006, an averager 1008, an averager 1010, an averager 1012, a subtractor 1014, a subtractor 1016, and a subtractor 1018. FIG. 10 further includes a PFD/T2D 1002, switch 404, digital loop filter 106 and DCO 108. In this illustration, each of demux 1004, mux 1006, averager 1008, averager 1010, averager 1012, subtractor 1014, subtractor 1016, and subtractor 1018 are illustrated as distinct devices. However, at least one of demux 1004, mux 1006, averager 1008, averager 1010, averager 1012, subtractor 1014, subtractor 1016, and subtractor 1018 may be combined as a unitary device.

Demux 1004 is arranged to receive select signal 910 from input divider 902 and a digital word 1020 from PFD/T2D 1002 and to output a phase difference (PD) pulse 1022 or a phase difference (PD) pulse 1024 or a phase difference (PD) pulse 1030 or a phase difference (PD) pulse 1036 based on select signal 910.

Averager 1008 is arranged to receive PD pulse 1024 from demux 1004 and to output an expected phase difference 1026. Averager 1010 is arranged to receive PD pulse 1030 from demux 1004 and to output an expected phase difference 1032. Averager 1012 is arranged to receive PD pulse 1036 from demux 1004 and to output an expected phase difference 1038.

Subtractor 1014 is arranged to receive AD pulse 1024, expected phase difference 1026 and to output a residual phase difference signal 1028. Subtractor 1016 is arranged to receive PD pulse 1030, expected phase difference 1032 and to output a residual phase difference signal 1034. Subtractor 1018 is arranged to receive PD pulse 1036, expected phase difference 1038 and to output a residual phase difference signal 1040.

Mux 1006 is arranged to receive select signal 910 from input divider 902, residual phase difference signal 1028 from subtractor 1014, residual phase difference signal 1034 from subtractor 1016 and residual phase difference signal 1040 from subtractor 1018 and to output corrected digital word 912.

FIG. 10 shows one exemplary embodiment of how devices demux 1004, mux 1006, averager 1008, averager 1010, averager 1012, subtractor 1014, subtractor 1016, and subtractor 1018 may be connected. However, intermediate circuitry may be included between any two devices which are connected directly in FIG. 10.

Note that phase difference (PD) pulses (1a, 1b, 1c, 1d, 2a, 2b, 2c, 2d) inside error corrector 904 correspond to their respective rising edges of reference clock signal 114 in FIG. 8. In the beginning, rising edges of reference clock signal 114 only at positions a (1a, 2a, etc.,) are fed to PFD/T2D 1002 and phase lock is established with feedback clock signal 410 in a conventional way. The remaining rising edges of reference clock signal 114 at positions b (1b, 2b, etc.,), c (1c, 2c, etc.,) and d (1d, 2d, etc.,) are ignored until the phase lock is established. This is explained in detail below with reference to FIG. 10.

In initial operation, switch 404 selects synchronized divided clock signal 126 as feedback clock signal 410 received by PFD/T2D 1002. Referring back to FIG. 8, at position 1a, phase difference between impulse 824 of reference clock signal 114 and impulse 840 of feedback clock signal 410 is calculated by PFD/T2D 1002 and is shown as PD pulse 1022 in FIG. 10. Until lock is established, only PD pulse 1022 is passed through error corrector 904 and the remaining PD pulses 1024, 1030 and 1036 are inactive. Select signal 910 for demux 1004 and mux 1006 inside error corrector 904 is controlled by input divider 902 in this embodiment.

Once lock is established, switch 404 provides synchronized divided clock signal 126 as feedback clock signal 410 to PFD/T2D 1002 for rising edges of reference clock signal 114 only at positions a. For rising edges of reference clock signal 114 at positions b, c and d switch 404 provides oscillator clock signal 122 as feedback clock signal 410 to PFD/T2D 1002. Now the phase difference between rising edges of reference clock signal 114 at positions b, c and d and their respective closest edge of oscillator clock signal 122 is measured. The phase difference for each rising edge of reference clock signal 114 at positions h, c and d is averaged by measuring it over a large number of cycles of reference clock signal 114 and is called the expected phase difference. This expected phase difference is subtracted from each measured value and the residual phase difference is fed in to the feedback loop. This will be explained in detail with respect to error corrector 904 of FIG. 10.

Referring back to FIG. 8, for rising edge of reference clock signal 114 at position 1b, phase difference between impulse 826 of reference clock signal 114 and rising edge 810 of oscillator clock signal 122 is measured by PFD/T2D 1002 and is transmitted as PD pulse 1024 to error corrector 904 as shown in FIG. 10. A phase difference between each rising edge of reference clock signal 114 at position b and its respective closest rising edge of oscillator clock signal 122 is also provided to averager 1008. Averager 1008 calculates the average of phase difference between successive PD pulses 1024 at position 1b, 2b, etc., and provides the expected phase difference 1026. This expected phase difference 1026 is subtracted from the corresponding measured PD pulse 1024 by subtractor 1014 and the residual phase difference signal 1028 is selected by mux 1006 accordingly.

Referring back to FIG. 8, for rising edge of reference clock signal 114 at position 1c, phase difference between impulse 828 of reference clock signal 114 and rising edge 814 of oscillator clock signal 122 is measured by PFD/T2D 1002 and is transmitted as PD pulse 1030 to error corrector 904 as shown in FIG. 10. Phase difference between each rising edge of reference clock signal 114 at position c and its respective closest rising edge of oscillator clock signal 122 is also provided to averager 1010. Averager 1010 calculates the average of phase difference between successive PD pulses 1030 at position 1c, 2c, etc., and provides the expected phase difference 1032. This expected phase difference 1032 is subtracted from the corresponding measured PD pulse 1030 by subtractor 1016 and the residual phase difference signal 1034 is selected by mux 1006 accordingly.

Referring back to FIG. 8, for rising edge of reference clock signal 114 at position 1d, phase difference between impulse 830 of reference clock signal 114 and rising edge 818 of oscillator clock signal 122 is measured by PFD/T2D 1002 and is transmitted as PD pulse 1036 to error corrector 904 as shown in FIG. 10. Phase difference between each rising edge of reference clock signal 114 at position d and its respective closest rising edge of oscillator clock signal 122 is also provided to averager 1012. Averager 1012 calculates the average of phase difference between successive PD pulses 1036 at position 1d, 2d, etc., and provides the expected phase difference 1038. This expected phase difference 1038 is subtracted from the corresponding measured PD pulse 1036 by subtractor 1018 and the residual phase difference signal 1040 is selected by mux 1006 accordingly.

This scheme allows the feedback loop to operate with an effective PFD frequency which is 4× the frequency of the feedback clock. This in turn increases the loop bandwidth of low power DPLL circuit 900 by a factor of 4, giving a large improvement in integrated phase noise. This scheme is extendable in principle to larger multiplication factors. Because PFD/T2D 1002 is directly connected to synchronized divided clock signal 126 at every fourth edge of reference clock signal 114, there is no occurrence of loss of frequency lock due to cycle slipping. If phase jitter is low enough, it may be possible to implement the power saving scheme described in FIG. 4 on top of the above scheme.

As discussed above, FIG. 9 and FIG. 10 illustrated how an example DPLL circuit in accordance with aspects of the present invention can be used to increase the frequency of reference clock signal of the example FM synthesizer module thus increasing loop bandwidth and reducing phase noise.

The same principle can be used to increase the effective PFD frequency in other scenarios. Consider an example where the oscillator frequency and the output frequency resolution requirement are such that they can support a feedback clock frequency of 2 MHz. It would then be preferable to make the PFD frequency equal to 2 MHz in order to maximize the loop bandwidth. Assume that the frequency of input clock signal 908 supplied by an external crystal is 13 MHz. 13 MHz cannot be evenly divided down to 2 MHz. In a conventional PLL, this situation is handled by dividing both the output clock and the 13 MHz reference clock all the way down to 1 MHz and operating the PFD at a 1 MHz frequency. This is not optimal for loop bandwidth. One way to generate 2 MHz reference clock signal 114 is to divide this by 6.5 by using the falling edge of 13 MHz input clock signal 908. Problem with this scenario is that unless input clock signal 908 has perfect 50% duty cycle, this leads to a non-uniform 2 MHz reference clock signal 114 as shown in FIG. 11.

Figure 11:
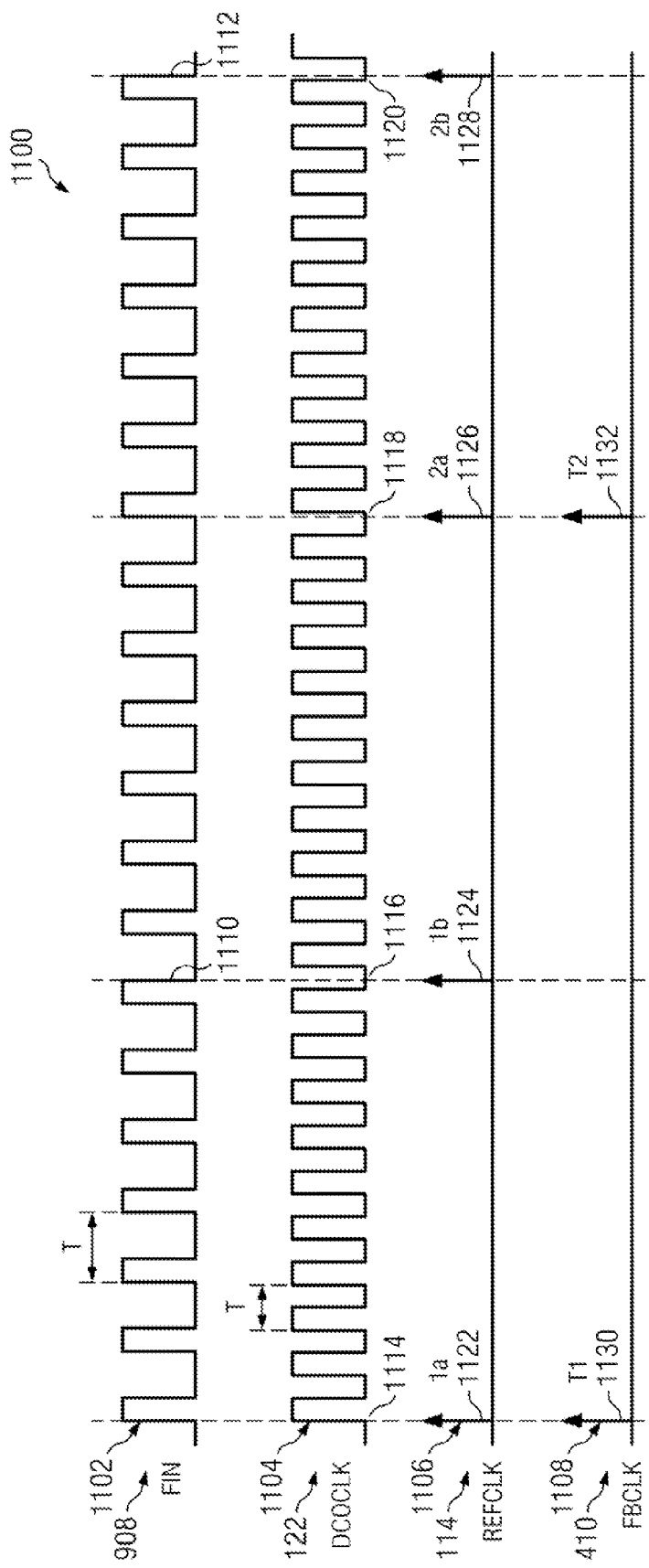
FIG. 11 illustrates timing diagrams for the DPLL of FIG. 9 in accordance with an aspect of the present invention.

FIG. 11 illustrates timing diagrams for modified low power DPLL circuit 900 in accordance with an aspect of the present invention.

FIG. 11 includes a waveform 1102 for input clock signal 908, a waveform 1104 for oscillator clock signal 122, an impulse waveform 1106 for reference clock signal 114, and an impulse waveform 1108 for feedback clock signal 410. Waveform 1102 includes input clock signal 908 with clock period of N. Waveform 1104 includes oscillator clock signal 122 with clock period of T. Impulse waveform 1106 includes impulses 1122 (indicated at position 1a), 1124 (indicated at position 1b), 1126 (indicated at position 2a), 1128 (indicated at position 2b), which represent corresponding rising edges for reference clock signal 114. Impulse waveform 1108 includes impulses 1130 at T1 and 1132 at T2, which represent corresponding rising edges for feedback clock signal 410.

As shown in FIG. 11, duty cycle N of waveform 1102 is not 50% that is, the time interval between impulse 1122 and 1124 and the time interval between impulse 1124 and 1126 are unequal. At positions 1a, 2a, etc., for reference clock signal 114 phase lock can be established with feedback clock signal 410. This is not possible at positions 1b, 2b, etc., for reference clock signal 114 because of the non-uniformity. The following strategy can be used to solve this problem.

For positions 1a, 2a, etc., of reference clock signal 114, a normal phase and frequency detection can be performed between reference clock signal 114 and feedback clock signal 410. For positions 1b, 2b, etc., of reference clock signal 114, a phase and frequency detection between an edge of reference clock signal 114 and the next closest edge of oscillator clock signal 122 is performed as shown in FIG. 12.

Figure 12:
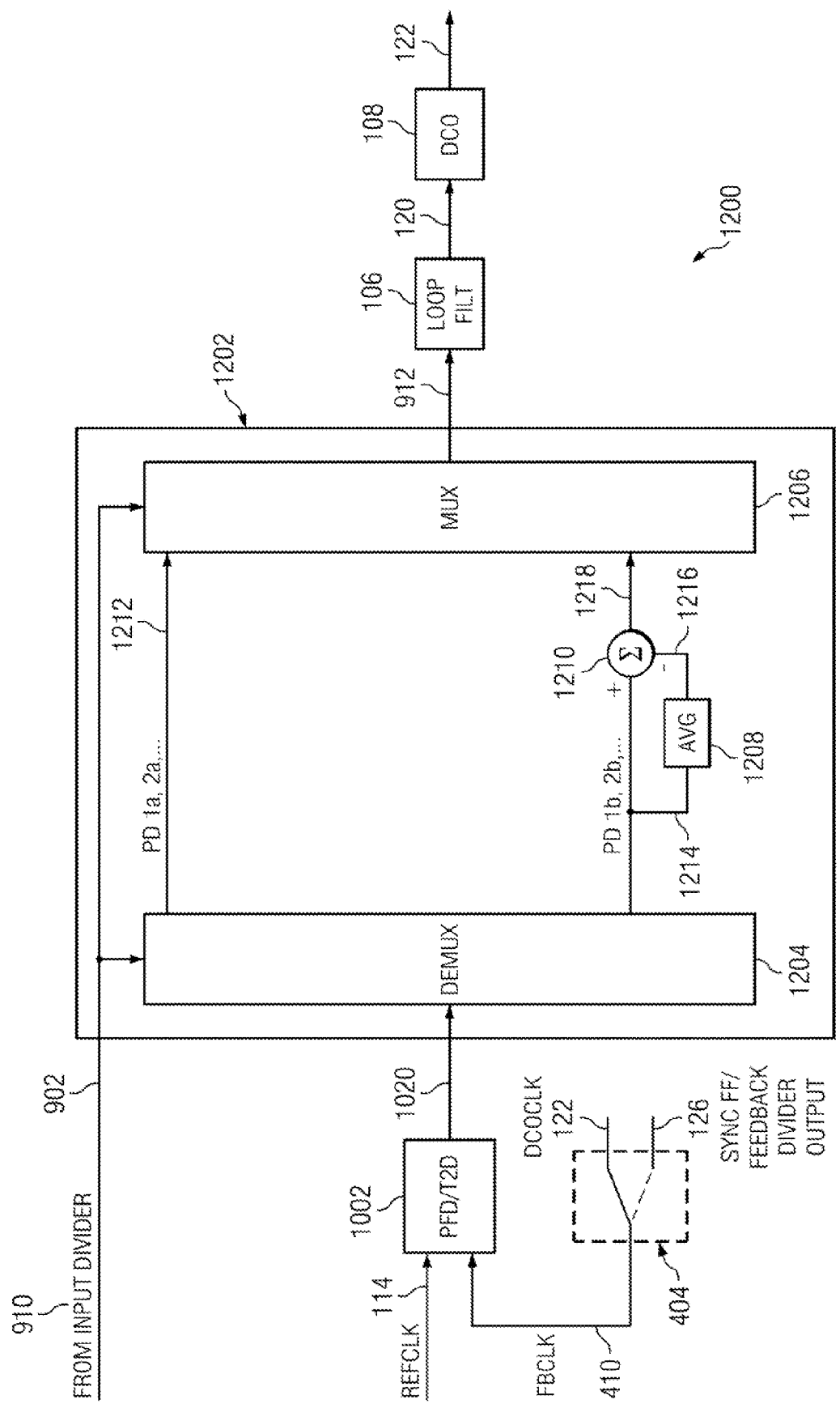
FIG. 12 illustrates an example error corrector in accordance with an aspect of the present invention.

FIG. 12 illustrates an example error corrector 1202 in accordance with an aspect of the present invention. Note that error corrector 1202 may be used in place of error corrector 904 of DPLL circuit 900 therefore the interface of error corrector 1202 with other elements of DPLL circuit 900 is shown to be the same.

As illustrated in the figure, error corrector 1202 includes a demux 1204, a mux 1206, an averager 1208 and a subtractor 1210. FIG. 12 further includes PFD/T2D 1002, switch 404, digital loop filter 106 and DCO 108. In this illustration, each of demux 1204, mux 1206, averager 1208 and subtractor 1210 are illustrated as distinct devices. However, at least one of demux 1204, mux 1206, averager 1208 and subtractor 1210 may be combined as a unitary device.

Demux 1204 is arranged to receive select signal 910 from input divider 902 and digital word 1020 from PFD/T2D 1002 and to output a PD pulse 1212 or a PD pulse 1214 based on select signal 910. Averager 1208 is arranged to receive PD pulse 1214 from demux 1204 and to output an expected PD pulse 1216. Subtractor 1210 is arranged to receive PD pulse 1214, expected PD pulse 1216 and to output a residual phase difference signal 1218. Mux 1206 is arranged to receive select signal 910 from input divider 902, PD pulse 1212 from demux 1204, residual phase difference signal 1218 from subtractor 1210 and to output corrected digital word 912.

FIG. 12 shows one exemplary embodiment of how devices demux 1204, mux 1206, averager 1208 and subtractor 1210 may be connected. However, intermediate circuitry may be included between any two devices, which are connected directly in FIG. 12.

Note that phase difference (PD) pulses (1a, 1b, 2a, 2b) inside error corrector 1202 correspond to their respective rising edges of reference clock signal 114 in FIG. 11. In the beginning, rising edges of reference clock signal 114 only at positions a (1a, 2a, etc.,) are fed to PFD/T2D 1002 and phase lock is established with feedback clock signal 410 in a conventional way. The remaining rising edges of reference clock signal 114 at positions b (1b, 2b, etc.,) are ignored until the phase lock is established. This is explained in detail below with reference to FIG. 12.

In initial operation, switch 404 selects synchronized divided clock signal 126 as feedback clock signal 410 received by PFD/T2D 1002. Referring back to FIG. 11, for positions a of reference clock signal 114, phase difference between impulse 1122 of reference clock signal 114 and impulse 1130 of feedback clock signal 410 is calculated by PFD/T2D 1002 and is shown as PD pulse 1212 in FIG. 12. Until lock is established, only PD pulse 1212 is passed through error corrector 1202 and PD pulse 1214 is inactive. Select signal 910 for demux 1204 and mux 1206 provided to error corrector 1202 is controlled by input divider 902 in this embodiment.

Once lock is established, switch 404 provides synchronized divided clock signal 126 as feedback clock signal 410 to PFD/T2D 1002 for rising edges of reference clock signal 114 only at positions a. For rising edges of reference clock signal 114 at position b, switch 404 provides oscillator clock signal 122 as feedback clock signal 410 to PFD/T2D 1002. Now the phase difference between rising edges of reference clock signal 114 at positions b and their respective closest edge of oscillator clock signal 122 is measured. The phase difference for each rising edge of reference clock signal 114 at positions b is averaged by measuring it over a large number of cycles of reference clock signal 114 and is called the expected phase difference. This expected phase difference is subtracted from each measured value and the residual phase difference is fed in to the feedback loop. This will be explained in detail with respect to error corrector 1202 of FIG. 12.

Referring back to FIG. 11, for rising edge of reference clock signal 114 at position 1b, phase difference between impulse 1124 of reference clock signal 114 and rising edge 1116 of oscillator clock signal 122 is measured by PFD/T2D 1002 and is transmitted as PD pulse 1214 to error corrector 1202 as shown in FIG. 12. Phase difference between each rising edge of reference clock signal 114 at position b and its respective closest rising edge of oscillator clock signal 122 is also provided to averager 1208. Averager 1208 calculates the average of phase difference between successive PD pulses 1214 at position 1b, 2b, etc., and provides the expected phase difference 1216. This expected phase difference 1216 is subtracted from the corresponding measured PD pulse 1214 by subtractor 1210 and the residual phase difference signal 1218 is selected by mux 1206 accordingly.

As discussed above, FIG. 11 and FIG. 12 illustrated how an example DPLL circuit in accordance with aspects of the present invention can be used to effectively multiply the frequency of reference clock signal 114 thus enhancing the loop bandwidth of low power DPLL circuit 900.

FIG. 8 through FIG. 12 illustrated example embodiments of an aspect of the present invention that uses an oscillator clock signal edge as a feedback clock signal edge under certain conditions to enhance loop bandwidth of a digital phase lock loop circuit, thus reducing phase noise.

Aspects of the present invention provide a new technique for DPLLs, wherein under certain conditions, the phase error is derived from a phase comparison between a reference clock edge and the next oscillator clock edge rather than a feedback clock edge. This technique significantly reduces DPLL power by disabling a feedback divider and sync FF once initial frequency lock is established, provided phase jitter of DPLL is low enough so that there is no cycle slip. Another application of this technique may be used in an FM synthesizer module to multiply the effective reference clock frequency of DPLL circuits resulting in an increase of loop bandwidth thus reducing phase noise. Both the applications of this technique can be combined in some circuits.

A "high" signal may imply "logic 1" or "logic high" and a "low signal" may imply "logic 0" or "logic low" in the above description.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

The invention claimed is:

1. A digital phase lock loop circuit for use with a reference clock signal, said digital phase lock loop circuit comprising:
   a phase detecting portion operable to output a compared signal based on the reference clock signal;
   an oscillator operable to output an oscillator clock signal;
   a feedback divider operable to output a divided signal based on the oscillator clock signal;
   a switching portion operable to output a first feedback signal based on the oscillator clock signal when in a first state, to output a second feedback signal based on the divided signal when in a second state and to switch from the first state to the second state, wherein said phase detecting portion is further operable to receive a first input feedback signal, based on the first feedback signal, when said switching portion is in the first state, and wherein said phase detecting portion is further operable to receive a second input feedback signal, based on the second feedback signal, when said switching portion is in the second state, wherein said phase detecting portion comprises a first flip-flop, a second flip-flop, an AND gate and a switch, wherein said first flip-flop is arranged to receive a VDD input, the reference clock signal and a clear signal and is operable to output an UP pulse, wherein said second flip-flop is arranged to receive an enable input, to receive the first input feedback signal when said switching portion is in the first state, to receive the second input feedback signal when said switching portion is in the second state and the clear signal and is operable to output a DOWN pulse, wherein said AND gate is arranged to receive the UP pulse and the DOWN pulse and is operable to output the clear signal, and wherein said switch is arranged to receive the DOWN pulse and is operable to output the DOWN pulse when said switching portion is in the first state and to not output the DOWN pulse when said switching portion is in the second state.

2. The digital phase lock loop circuit of claim 1, wherein said phase detecting portion is further to operable to output the compared signal based on the reference clock signal and the first input feedback signal when said switching portion is in the first state, and wherein said phase detecting portion is further to operable to output the compared signal based on the reference clock signal and the second input feedback signal when said switching portion is in the second state.

3. The digital phase lock loop circuit of claim 2, further comprising a time-to-digital portion operable to output a digital delay signal based on the compared signal.

4. The digital phase lock loop circuit of claim 3, further comprising:

a loop filter portion operable to output a filtered delay signal based on the digital delay signal, wherein said oscillator is operable to output the oscillator clock signal based on the filtered delay signal.

5. The digital phase lock loop circuit of claim 4, further comprising:

a synchronization flip-flop operable to output a synchronized signal based on the oscillator clock signal and the divided signal, wherein said switching portion is operable to output the second feedback signal based on the synchronized signal when in a second state.

6. The digital phase lock loop circuit of claim 5, further comprising a lock detector portion operable to detect a parameter based on the reference clock and to switch said switching portion from the first state to the second state based on the detected parameter.

7. The digital phase lock loop circuit of claim 6, further comprising:

an input divider operable to output a select signal; and
an output divider operable to output a divided output signal.

8. The digital phase lock loop circuit of claim 7, further comprising an error corrector operable to output a corrected digital delay signal based on the digital delay signal and the select signal.

9. The digital phase lock loop circuit of claim 1, further comprising:

an input divider operable to output a select signal; and
an output divider operable to output a divided output signal.

10. The digital phase lock loop circuit of claim 9, further comprising an error corrector operable to output a corrected digital delay signal based on the digital delay signal and the select signal.

11. The digital phase lock loop circuit of claim 10, wherein said error corrector comprises a demultiplexer, an averager, an adder and a multiplexer, wherein said demultiplexer is arranged to receive the digital delay signal and the select signal, and is operable to output a first phase difference signal and a second phase difference signal based on the select signal, wherein said averager is operable to receive the second phase difference signal and to output an expected phase difference signal based on the second phase difference signal, wherein said adder is operable to output a residual phase difference signal based on the second phase difference signal and the expected phase difference signal, and wherein said multiplexer is operable to output, based on the select signal, a corrected digital delay signal based on the first phase difference signal and the residual phase difference signal.

12. A digital phase lock loop circuit for use with a reference clock signal, said digital phase lock loop circuit comprising:

a phase detecting portion operable to output a compared signal based on the reference clock signal;

an oscillator operable to output an oscillator clock signal;

a feedback divider operable to output a divided signal based on the oscillator clock signal;

a switching portion operable to output a first feedback signal based on the oscillator clock signal when in a first state, to output a second feedback signal based on the divided signal when in a second state and to switch from the first state to the second state;

a time-to-digital portion operable to output a digital delay signal based on the compared signal;

a loop filter portion operable to output a filtered delay signal based on the digital delay signal;

a synchronization flip-flop operable to output a synchronized signal based on the oscillator clock signal and the divided signal;

a lock detector portion operable to detect a parameter based on the reference clock and to switch said switching portion from the first state to the second state based on the detected parameter;

an input divider operable to output a select signal;

an output divider operable to output a divided output signal; and an error corrector operable to output a corrected digital delay signal based on the digital delay signal and the select signal, wherein said phase detecting portion is further operable to receive a first input feedback signal, based on the first feedback signal, when said switching portion is in the first state, wherein said phase detecting portion is further operable to receive a second input feedback signal, based on the second feedback signal, when said switching portion is in the second state, wherein said phase detecting portion is further to operable to output the compared signal based on the reference clock signal and the first input feedback signal when said switching portion is in the first state, wherein said phase detecting portion is further to operable to output the compared signal based on the reference clock signal and the second input feedback signal when said switching portion is in the second state, wherein said oscillator is operable to output the oscillator clock signal based on the filtered delay signal, wherein said switching portion is operable to output the second feedback signal based as the synchronized signal when in a second state, wherein said error corrector comprises a demultiplexer, an averager, an adder and a multiplexer, wherein said demultiplexer is arranged to receive the digital delay signal and the select signal, and is operable to output a first phase difference signal and a second phase difference signal based on the select signal, wherein said averager is operable to receive the second phase difference signal and to output an expected phase difference signal based on the second phase difference signal, wherein said adder is operable to output a residual phase difference signal based on the second phase difference signal and the expected phase difference signal, and wherein said multiplexer is operable to output, based on the select signal, a corrected digital delay signal based on the first phase difference signal and the residual phase difference signal.

13. A method of digitally phase locking an output signal with a reference clock signal, said method comprising:

outputting, by way of a phase detecting portion, a compared signal based on the reference clock signal;

outputting, by way of an oscillator, an oscillator clock signal;

outputting, by way of a feedback divider, a divided signal based on the oscillator clock signal;

outputting, by way of a switching portion, a first feedback signal based on the oscillator clock signal when the switching portion is in a first state;

outputting, by way of the switching portion, a second feedback signal based on the divided signal when the switching portion is in a second state;

switching the switching portion from the first state to the second state;

receiving, at an input of the phase detecting portion, a first input feedback signal; based on the first feedback signal, when the switching portion is in the first state;

receiving, at the input of the phase detecting portion, a second input feedback signal, based on the second feedback signal, when the switching portion is in the second state;

outputting, by way of an input divider, a select signal; and outputting, by way of an output divider, a divided output signal.

14. The method of claim 13, wherein said outputting a compared signal based on the reference clock signal comprises outputting the compared signal based on the reference clock signal and the first input feedback signal when the switching portion is in the first state, and wherein said outputting a compared signal based on the reference clock signal further comprises outputting the compared signal based on the reference clock signal and the second input feedback signal when the switching portion is in the second state.

15. The method of claim 14, further comprising outputting, by way of a time-to-digital portion, a digital delay signal based on the compared signal.

16. The method of claim 15, further comprising:

outputting, by way of a loop filter portion, a filtered delay signal based on the digital delay signal, wherein said outputting an oscillator clock signal comprises outputting the oscillator clock signal based on the filtered delay signal.

17. The method of claim 16, further comprising:

outputting, by way of a synchronization flip-flop, a synchronized signal based on the oscillator clock signal and the divided signal, wherein said outputting a second feedback signal based on the divided signal when the switching portion is in a second state comprises outputting the second feedback signal based on the synchronized signal when in a second state.

18. The method of claim 17, further comprising:

detecting, by way of a lock detector portion, a parameter based on the reference clock, wherein said switching the switching portion from the first state to the second state comprises switching the switching portion from the first state to the second state based on the detected parameter.

* * * * *